United States Patent
Voss-Kehl et al.

(10) Patent No.: US 7,033,667 B2
(45) Date of Patent: Apr. 25, 2006

(54) PRINTED CIRCUITS ON SHRINK FILM

(75) Inventors: Jessica L. Voss-Kehl, Inver Grove Heights, MN (US); Kurt J. Halverson, Lake Elmo, MN (US); Caroline M. Ylitalo, Stillwater, MN (US); Matthew R. Lehmann, St. Paul, MN (US); Steven J. Botzet, Hudson, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/739,807

(22) Filed: Dec. 18, 2003

(65) Prior Publication Data

US 2005/0136231 A1 Jun. 23, 2005

(51) Int. Cl.
*B32B 3/00* (2006.01)

(52) U.S. Cl. ............... 428/209; 428/356; 428/901; 174/257; 174/258

(58) Field of Classification Search ........... 428/209, 428/901, 356; 174/257–258
See application file for complete search history.

(56) References Cited

U.S. PATENT DOCUMENTS

| | | | |
|---|---|---|---|
| 3,963,522 A | 6/1976 | Harada et al. | |
| 4,725,478 A | 2/1988 | Mathias et al. | |
| 6,376,619 B1 | 4/2002 | Halverson et al. | |
| 6,395,483 B1 | 5/2002 | Patil et al. | |
| 6,467,897 B1 * | 10/2002 | Wu et al. ............ | 347/102 |
| 6,482,638 B1 | 11/2002 | Patil et al. | |
| 6,548,607 B1 | 4/2003 | Halverson et al. | |
| 6,573,338 B1 | 6/2003 | Halverson et al. | |
| 6,586,483 B1 | 7/2003 | Kolb et al. | |
| 6,593,089 B1 | 7/2003 | Patil et al. | |
| 2003/0146019 A1 | 8/2003 | Hirai | |
| 2005/0136638 A1 | 6/2005 | Voss-Kehl et al. | |

FOREIGN PATENT DOCUMENTS

| | | |
|---|---|---|
| EP | 1 284 301 A1 | 2/2003 |
| JP | 2002-134878 | 5/2002 |
| JP | 2002-266002 | 9/2002 |
| JP | 2002-299833 | 10/2002 |
| JP | 2002-309303 | 10/2002 |
| WO | WO 01/66244 A1 | 9/2001 |
| WO | WO 02/087551 A1 | 11/2002 |
| WO | WO 02/092722 A1 | 11/2002 |
| WO | WO 03/038002 A1 | 5/2003 |

OTHER PUBLICATIONS

"Kirk-Orthmer Encyclopedia of Chemical Technology", Fourth Edition (1996), vol. 20, John Wiley and Sons, New York, pp. 112-117.

Brust et al., "Synthesis of Thiol-derivatised Gold Nanoparticles in a Two-phase Liquid-Liquid System", J. Chem. Soc., Chem. Commun., 1994, pp. 801-902.

* cited by examiner

*Primary Examiner*—Cathy F. Lam

(57) ABSTRACT

Methods of creating fine featured circuits by printing a circuit trace onto polymer shrink films or other biaxially-oriented polymer films are disclosed. The shrink films are heated and shrunk after printing, annealing the circuit trace to form conductive features. Compositions suitable for printing onto the films and articles made using the method and composition are also disclosed.

3 Claims, 2 Drawing Sheets

PRINTED CIRCUITS ON SHRINK FILM

BACKGROUND

The ability to manufacture electronic circuitry with increasingly fine features has become important for many electronic devices. Increasing the resolution of electronic circuitry typically enables a reduction in the total size of the circuitry. Fine resolution circuitry is generally produced based on non-digital technologies, such as photolithography, micro-contact printing, and vapor deposition, all of which involve the use of hard tooling in some form.

For rapid prototyping, custom circuitry, or short run manufacturing, these non-digital approaches typically become too expensive and therefore impractical. These customized applications would benefit from a digital methodology that allows for rapid modifications of designs. However, existing digital methods generally fail to produce feature sizes smaller than 50–70 micrometers.

SUMMARY OF THE INVENTION

In certain implementations the present invention includes a method of forming a substrate containing conductive traces, such as electronic circuits. The method includes providing a shrinkable polymeric film, and depositing a substantially non-conductive coating onto a portion of the polymeric film. The temperature of the shrinkable polymeric film and coating is elevated such that the projected surface area of the polymeric film shrinks by at least 50 percent and the non-conductive coating becomes at least 100 percent more conductive. The invention is also directed to a method of forming a conductive trace. The method includes providing a shrinkable polymeric film; depositing a coating on a portion of the polymeric film; and elevating the temperature of the shrinkable polymeric film such that the projected surface area of the film shrinks by at least 80 percent. Articles made using these methods are also within the scope of the invention.

Materials and methods of the present invention generally are useful in the manufacture of fine resolution circuitry, typically, quickly, inexpensively, and without the need for custom hard tooling.

In a first aspect, the present invention includes a method of forming a conductive trace comprising providing a shrinkable polymeric film; depositing a substantially non-conductive coating on a portion of the polymeric film; elevating the temperature of the shrinkable polymeric film and the substantially non-conductive coating such that the polymeric film shrinks by at least 50 percent and the non-conductive coating becomes at least 100 percent more conductive. The polymeric film generally shrinks to less than 50 percent of its original projected surface area, sometimes less than 10 percent of its original projected surface area, and in certain embodiments less than 5 percent of its original projected surface area.

The substantially non-conductive coating applied to the shrink film can be, for example, a printable composition containing metal nanoparticles, such as silver nanoparticles. In some embodiments the nanoparticles have an average size of 1 to 1,000 nanometers (nm), alternatively an average size of 1 to 100 nm, and optionally an average size of 1 to 20 nm. In general it is desirable to have relatively small particles so as to keep the sintering temperature low.

The printable composition contains from less than 80 weight percent metal particles in some embodiments, and typically greater than 5 weight percent metal particles. In some embodiments the printable composition contains from 10 to 70 weight percent metal particles, others from 30 to 60 weight percent metal particles, and from 15 to 50 weight percent in other embodiments. Typically, the composition contains less than 50 weight percent metal particles, often less than 30 weight percent metal particles, and frequently less than 20 weight percent metal particles. It can be desirable to have relatively low levels of metals in order to have good adhesion to the shrink film, which has been observed to improve as concentrations drop in some implementations.

When the printable composition is applied to the shrink film it is typically not conductive. In some implementations the coating material itself is conductive, but is deposited discontinuously such that the various continuous areas are not conductive with one another, or have only a relatively low conductivity. This increase in conductivity is observable, for example, by measuring the resistively at two points.

Various other features and advantages of the present invention should become readily apparent with reference to the following detailed description, examples, claims and appended drawings. In several places throughout the specification, guidance is provided through lists of examples. In each instance, the recited list serves only as a representative group and should not be interpreted as an exclusive list.

BRIEF DESCRIPTION OF THE FIGURES

The invention will be further described by reference to the following figures.

Figure 1:
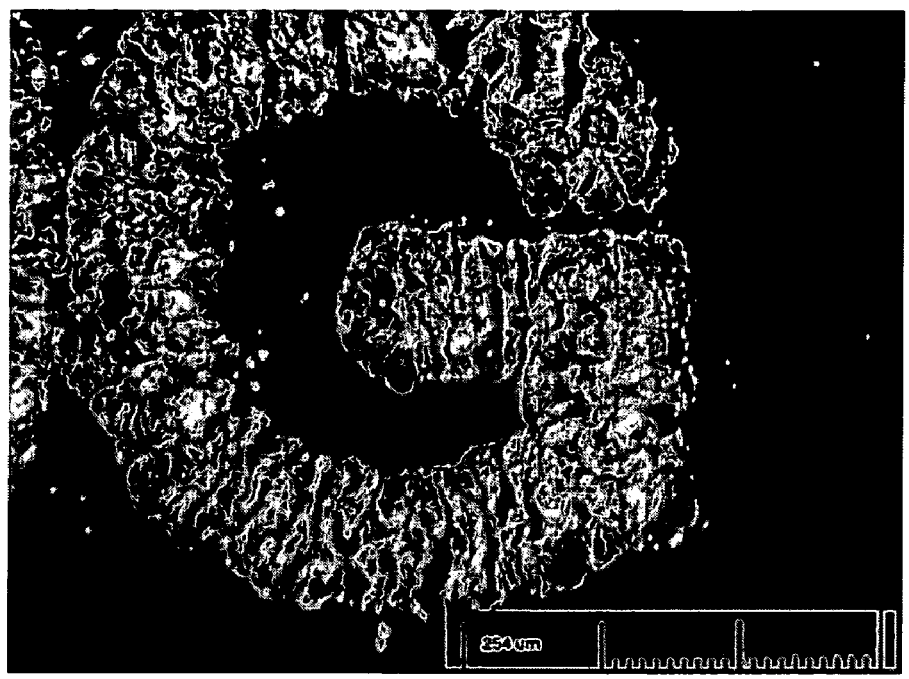
FIG. 1 shows a photomicrograph of a polymeric substrate containing a conductive trace formed in accordance with an implementation of the invention.

Various aspects of the invention will now be described in greater detail by reference to the following detailed description.

DETAILED DESCRIPTION

The present invention is directed to methods of creating fine featured circuits by printing onto polymer shrink films or other biaxially-oriented polymer films circuit traces or patterns, thermally shrinking the printed film, and annealing or curing the circuit traces to form conductive features. This digital deposition approach reduces the total number of processing steps required to produce circuits and eliminates the waste associated with typical subtractive processes. Digital printing also allows for increased flexibility in manufacturing, typically allowing for easy and inexpensive fabrication, rapid prototyping, and custom circuitry. In addition, the present invention has advantages, because the film may be shrunk and the circuit traces simultaneously annealed (e.g., if a conductive polymer is adhered to the film), thereby reducing manufacturing steps used to make high quality, fine traces.

The relative positions of traces occupied by the printed composition prior to shrinking the laminate are generally maintained after the laminate is shrunk. With respect to oriented films, the reduction may be effected by the application of heat, although other modes of relaxing oriented films can be used. The mode of size alteration, such as the application of heat, can be selected so that it does not substantially impair the activity of the printed composition. Reducing the size of the printed patterns by 4-fold, 10-fold, or even greater than 20-fold may be achieved according to the claimed method.

As used herein:

"Heat-relaxable" or "heat-shrinkable" shall mean, in the context of a material such as a substrate, that the material undergoes some relaxation or shrinkage in at least one dimension in response to the transmission of thermal energy into the material.

"Relaxable" shall mean, in the context of a material such as a substrate, that the material is capable of relaxing or shrinking, in at least one direction. Preferably, shrinkage occurs by at least about 10%.

"Shrinkable," "shrinking" or "shrunk" shall mean, in the context of a material such as a substrate, that the material is capable of being, is, or has been decreased in its length in at least one dimension, whether by recovery, relaxation, or any other means.

"Substantially non-conducting" refers to materials having a sheet resistance of greater than 10,000 ohms per square.

"Projected surface area" refers to the surface area for a surface as is calculated with respect to the plane encompassing the "X" and "Y" axes of the surface.

Percent shrinkage of the substrate is calculated using the following equation: percent shrinkage=100 percent×[pre-shrinking projected surface area−post-shrinking projected surface area]/pre-shrinking projected surface area.

Various aspects of the invention, including the polymeric substrate and printable composition will now be described in greater detail.

Polymeric Substrate

In a first regard, the present invention includes the use of films composed of a shrinkable, polymeric material onto which a printable composition is deposited. Many polymeric materials may be suitable for use in the film. The polymeric film can be, for example, a polyethylene shrink film or other oriented polymer films, typically a biaxially oriented polymer film. For certain embodiments, the films shrink in at least one direction within the film plane if energy such as heat is applied to the film for a specified period of time. With respect to oriented films, relaxation of the film need not be equal in any two orthogonal directions within the film plane. In one embodiment, relaxation is substantially uniform. In this embodiment, the oriented film relaxes in substantially the same amount in each direction, regardless of position on the film plane.

Oriented films suitable for use with the invention include, but are not limited to, biaxially oriented low-density polyethylenes, biaxially oriented linear low-density polyethylenes, biaxially oriented polypropylene and biaxially oriented ultra low-density polyethylenes. Biaxially oriented films exhibit shrinkage in two orthogonal in-plane directions (hereafter referred to as the "x" and "y" directions).

Other oriented films that may be suitable for use include uniaxially, biaxially, or multiaxially oriented films made by any process known to the art, including, but not limited to: melt-orientation; the blown film, bubble, double-bubble, and tubular processes; length orientation; the process of tentering; extension over a mandrel; thermoforming; and blow molding.

Polymers which may be employed in such films include, but are not limited to: polyethylenes, including high density polyethylene, low density polyethylene, linear low density polyethylene, ultra low density polyethylene, and copolymers of ethylene (including ethylene propylene copolymers and ethylene vinyl acetate copolymers); polyolefins, including isotactic polypropylene, syndiotactic polypropylene, and polymethylpentene; polyacetals; polyamides, including nylon 6 and nylon 6,6; polyesters, including polyethylene terephthalate, polybutylene terephthalate, and polyethylene naphthalate; halogenated polymers, including polyvinyl chloride, polyvinylidene chloride, polychlorotrifluoroethylene, polyvinyl fluoride, and polyvinylidene fluoride; styrene polymers, including general purpose polystyrene and syndiotactic polystyrene; cellulose esters, including cellulose acetate and cellulose propionate; polyketones, including polyetheretherketone and copolymers and terpolymers of carbon monoxide with ethylene and/or propylene; polycarbonates, including the polycarbonate of bisphenol A; phenyl-ring polymers, including polyphenylene sulfide; polysulfones; polyurethanes; polymers of acrylic and methacrylic acids and their esters; ionomers; and copolymers, blends, or layered structures of any of the above-named polymers. Oriented films of any of these polymers may be optionally cross-linked.

The polymeric substrate may optionally be surface treated (e.g., corona treated) or have a polymeric coating (e.g., a primer) thereon.

Printable Composition

Suitable printable compositions used to form the conductive elements include inks containing metal nanoparticles. Useful metal nanoparticles include, but are not limited to, those comprising lead, tin, iron, nickel, copper, platinum, palladium, gold, silver, alloys thereof, and mixtures thereof. Metal containing materials other than nanoparticles can be used, such as oxides and salts of metals. For example, in certain embodiments, solutions of silver oxides, silver chloride, and/or silver nitrate can be used as the printable composition. Other suitable materials include compositions containing conductive polymers. The printable composition can include organic solvents or water, and are typically printable using digital methods, such as inkjet printing.

The metal nanoparticles used in the printable composition are normally dispersed in a solvent so as to make them printable using inkjet technology. The printable composition can be aqueous or organic solvent-based. Typical organic solvents include ketones such as cyclohexanone and methyl ethyl ketone; alcohols such isopropanol, butyl alcohol, ethanol; alkanes such as tetradecane; esters such as ethyl acetate; propylene glycol monomethyl ether acetate; glycols such as propylene glycol, glycerol, diethylene glycols; and mixtures thereof.

To prevent particle agglomeration and settling, metal nanoparticles used in certain embodiments of printable composition can be surface treated. Suitable surface treatments include alcohols, such as decanol, to prevent clumping and clustering of the particles, thereby aiding in their printing with an inkjet printer. Additional surface treatments include thiols, surfactants, and carboxylic acids. Surface modification techniques include those disclosed in U.S. Pat. No. 6,586,483 to Kolb et al.

The printable composition can also include a binder comprising, for example, a polymer, curable polymer, oligomer, or monomer. Suitable binders are known in the art. The binder can be conductive or non-conductive. When the binder is non-conductive it is generally desirable to have some or all of the binder removed during heating.

Regardless of the conductive elements, the printable composition may contain solvent (e.g., volatile solvent). Solvent may be present in amount sufficient to adjust the viscosity of the printable composition, for example, to a viscosity suitable for a chosen digital application method. For example, if inkjet printing is chosen as the digital application method, the printable composition may be adjusted by addition of solvent to a viscosity of less than or equal to 30 millipascal-seconds at 60° C. Exemplary solvents include water, organic solvents (e.g., mono-, di- or tri-ethylene glycols or higher ethylene glycols, propylene glycol, 1,4-butanediol or ethers of such glycols, thiodiglycol, glycerol and ethers and esters thereof, polyglycerol, mono-, di- and tri-ethanolamine, propanolamine, N,N-dimethylformamide, dimethylsulfoxide, N,N-dimethylacetamide, N-methylpyrrolidone, 1,3-dimethylimidazolidone, methanol, ethanol, isopropanol, n-propanol, diacetone alcohol, acetone, methyl ethyl ketone, propylene carbonate), and combinations thereof. The printable composition may contain one or more optional additives such as, for example, colorants (e.g., dyes and/or pigments), thixotropes, thickeners, or a combination thereof.

Printing and Subsequent Processing

The printable composition of the invention is suitable for digital deposition onto a polymeric film. Useful digital application methods include, for example, spray jet, valve jet, and inkjet printing methods. Techniques and formulation guidelines are well known (see, for example, "Kirk-Othmer Encyclopedia of Chemical Technology", Fourth Edition (1996), volume 20, John Wiley and Sons, New York, pages 112–117, the disclosure of which is incorporated herein by reference) and are within the capability of one of ordinary skill in the art. Combinations of these methods may also be employed in practice of the present invention. Of these methods, inkjet printing methods are typically well suited for applications in which fine resolution is desired.

Inkjet printing technology is useful to precisely apply the printable composition. Inkjet printing of the printable composition can provide many advantages over conventional methods of applying conducting traces to a substrate. Inkjet printing is a non-contact printing method, thus allowing conducting materials to be printed directly onto substrates without damaging and/or contaminating the substrate surface due to contact, as may occur when using screens or tools and/or wet processing during conventional printing. Inkjet printing also provides a highly controllable printing method that can produce precise and consistently applied material. Controllable dimensions for the conducting traces are desirable for many applications.

Exemplary inkjet printing methods include thermal inkjet, continuous ink-jet, piezo inkjet, acoustic inkjet, and hot melt inkjet printing. Thermal inkjet printers and/or print heads are readily commercially available, for example, from Hewlett-Packard Corporation (Palo Alto, Calif.), and Lexmark International (Lexington, Ky.). Continuous inkjet print heads are commercially available, for example, from continuous printer manufacturers such as Domino Printing Sciences (Cambridge, United Kingdom). Piezo inkjet print heads are commercially available, for example, from Trident International (Brookfield, Conn.), Epson (Torrance, Calif.), Hitachi Data Systems Corporation (Santa Clara, Calif.), Xaar PLC (Cambridge, United Kingdom), Spectra (Lebanon, N.H.), and Idanit Technologies, Limited (Rishon Le Zion, Israel). Hot melt inkjet printers are commercially available, for example, from Xerox Corporation (Stamford, Conn.).

Inkjet printing can also provide a higher degree of confidence that the surface has been properly printed. If it is determined that a portion of the surface has not been properly printed, then printing with inkjet allows the ability to go back and print skipped areas in the appropriate locations. Inkjet printing is also highly versatile in that printing patterns can be easily changed, whereas screen printing and other tool-based techniques require a different screen or tool to be used with each individual pattern. Thus, ink-jet printing does not require a large inventory of screens or tools that need to be cleaned and maintained. Also, additional printable compositions can be inkjet printed onto previously formed conducting traces to create larger (e.g., taller) traces, for example, in the construction of various electronic devices.

In order to be inkjet printed, the composition typically has a viscosity greater than 1 millipascal-second, but usually less thans 40 millipascal-seconds at the print head operating temperature, as measured using continuous stress sweep over shear rates of from 1 second$^{-1}$ to 1000 seconds$^{-1}$. In some implementations, the composition has a viscosity of 8–20 millipascal-seconds at the print head operating temperature, as measured using continuous stress sweep, over shear rates of 1 second$^{-1}$ to 1000 seconds$^{-1}$.

After printing, the polymeric shrink film substrate is typically shrunk using a heat source, such as by convection or contact heating. Also, in some implementations the heating process may be performed by microwave, radio frequency or infrared radiation.

In certain embodiments, the printed composition shows a significant increase in conductivity after being heated sufficiently to shrink the polymeric film. In some implementations the printed composition has a resistance of greater than 10,000 ohms per square prior to heating, frequently greater than 5,000 ohms per square prior to heating, and typically greater than 2,000 ohms per square prior to heating. In contrast, after heating the resistance diminishes to less than 2,000 ohms per square in most implementations, is less than 200 ohms per square in other implementations, and is below 10 ohms per square in yet other implementations.

Devices and Circuits

Methods and articles of the present invention may be used in a wide variety of electronic devices. Examples include sensors, touch screens, transistors, diodes, capacitors (e.g., embedded capacitors), and resistors, which can be used in various arrays to form amplifiers, receivers, transmitters, inverters, and oscillators.

Various coatings can also be applied to the films to aid in the retention of the printable composition. Also a backing may be applied to the substrate to maintain the substrate in a less than oriented state. The backing may optionally include a release liner to permit the backing to be removed if desired.

EXAMPLES

These examples are merely for illustrative purposes only and are not meant to be limiting on the scope of the appended claims. All parts, percentages, ratios, etc. in the examples and the rest of the specification are by weight, unless noted otherwise. Unless otherwise noted, all reagents used in the examples were obtained, or are available, from general chemical suppliers such as, for example, Sigma-Aldrich Company, Saint Louis, Mo., or may be synthesized by conventional methods.

n-Tetradecane used in the examples was obtained from Avocado Research Chemicals, Ltd.; Lancashire, England.

TABLE OF ABBREVIATIONS

| Abbreviation | Description |
|---|---|
| Silver Ink 1 | A silver nanoparticulate ink from Harima Chemical. Company; Tokodai, Japan, used as received as a stable dispersion of ~58 percent by weight 7 nanometer silver |

-continued

TABLE OF ABBREVIATIONS

| Abbreviation | Description |
|---|---|
| | particles, surface treated with decanol and dispersed in n-tetradecane, as described in JP200266002A. |
| Silver Ink 2 | Same as Silver Ink-1 but diluted to 27.5 percent by weight silver with n-tetradecane. |
| Shrink Film 1 | Non-coated polyethylene shrink film, 25.4 micrometers (1 mil) thickness, commercially available under the trade designation "CRYOVAC D955" from Sealed Air Corporation, Saddlebrook, New Jersey. |
| Shrink Film 2 | Azlactone/dimethylacrylamide copolymer coated polyethylene shrink film, Corona treated prior to coating, 0.1 micrometer coating thickness, prepared generally according to the procedure described in U.S. Pat. No. 6,482,638 (Patil et al.). |
| Shrink Film 3 | Titanium metal coated film (10.0 nm), followed by azlactone/dimethylacrylamide coating (0.1 micrometer) as described in U.S. Pat. No. 6,482,638 (Patil et al.). |

Test Methods

Resistivity Test

The resistivity of prepared and cured coatings was measured using a MODEL 717 CONDUCTANCE MONITOR commercially available from Delcom Instruments, Inc., Prescott Wis., which was operated at a frequency of 1 MHz, or using a model SRM-232-2000 Surface Resistivity Meter commercially available from Guardian Manufacturing, Rockledge, Fla. The results are reported in ohms per square (ohm/sq.).

Examples 1–6

Silver Ink-1 (Example 1–3) and Silver Ink-2 (Example 4–6) were printed at 317×295 dots per inch (dpi) resolution using a piezo inkjet print head obtained under the trade designation "XJ128-200" from Xaar PLC, Cambridge, United Kingdom, and mounted on an XY translational stage. The print head was driven at 1250 Hz and 35 Volts. Samples were printed onto Shrink Films 1–3 in a variety of patterns with varying feature sizes and dried in 100° C. oven for 10 minutes.

The three printed shrink films were shrunk by placing the printed shrink films between two flat polytetrafluoroethylene-coated mesh screens. The screens were then placed into a 170° C. oven for 45 seconds, after which no further relaxation in the shrink films was observed, resulting in an overall area reduction of approximately 25-fold. The screens holding the shrunk film samples were then removed from the oven and allowed to cool to room temperature, and the shrunk film was removed from in between the screens.

Samples of the printed films (after shrinking) prepared above were placed into a 250° C. oven for 1 hour. Light microscopy was used to observe the printed ink features on the printed films after shrinking.

Figure 2:
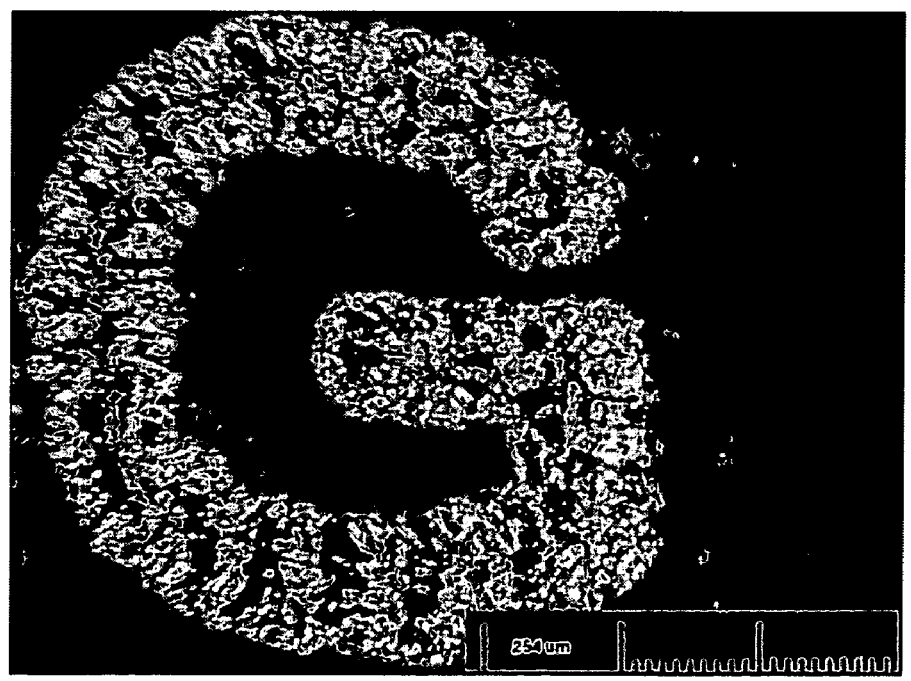
FIG. 2 shows a photomicrograph of a polymeric substrate containing a conductive trace formed in accordance with an implementation of the invention.

The non-printed surface of Shrink Film 1 remained flat upon shrinking, while the coatings on Shrink Films 2 and 3 showed wrinkling following thermal shrinking. The non-printed surface of Shrink Film 2 formed 0.1–1 micrometer sized features during the shrink process, while the non-printed surface of Shrink Film 3 formed features on the order of 20 micrometers during the shrink process. FIGS. 1 and 2 show a close up of one of the printed features on printed Shrink Films 1 and 2, respectively (the letter "G").

On each printed film (after shrinking) the printed feature or trace was observed to be reduced in area by approximately a factor of 25 as compared to the original trace size.

Referring now to FIG. 1 (Example 4), the unprinted film surface remained flat, while the printable formulations formed large undulations or wrinkles.

Referring now to FIG. 2 (Example 5), smaller wrinkles or undulations were formed in the regions containing the printable composition.

Figure 3:
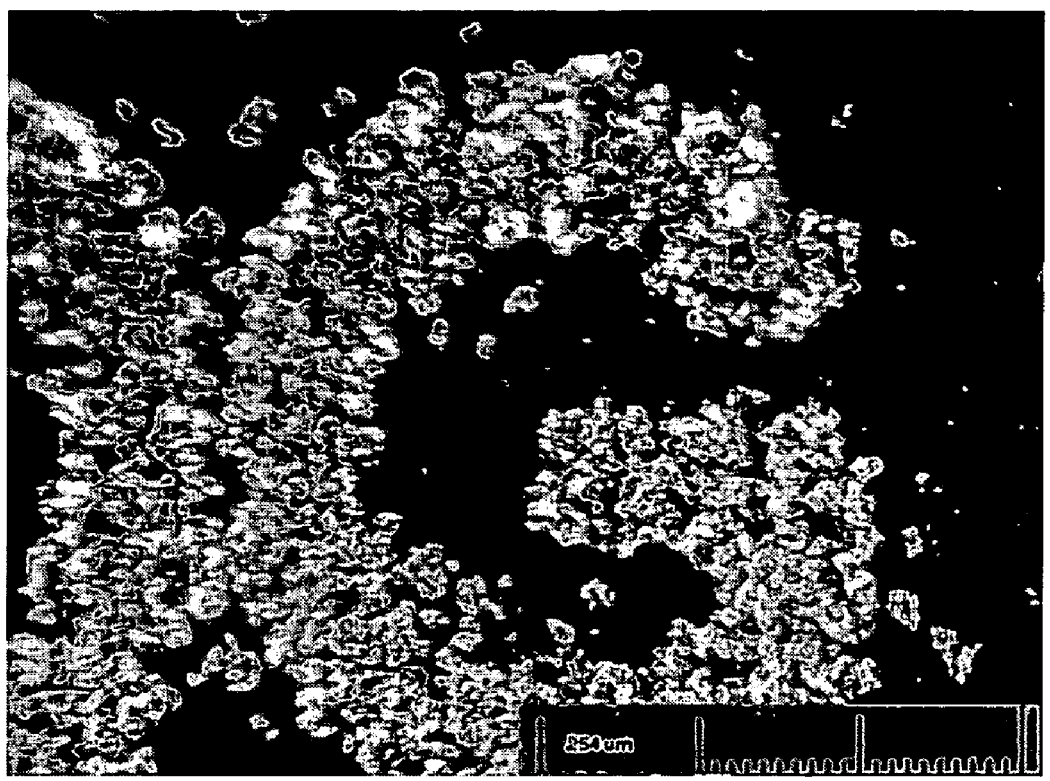
FIG. 3 shows a photomicrograph of a polymeric substrate containing a conductive trace formed in accordance with an implementation of the invention.

Referring now to FIG. 3 (Example 6), the undulations in the printable composition-coated portions tended to trace or follow the wrinkle pattern of the uncoated region.

On each Shrink Film printed using Silver Ink 2, little or no delamination or sloughing of the printable composition was observed after the shrink process.

Some delamination of the printable composition was observed using Silver Ink 1 on Shrink Film 1. The coated films were also examined after the annealing process. No qualitative difference in the appearance of the shrunk patterns was observed.

Resistivity of the printable composition patterns after shrinkage was according to the Resistivity Test. Results are reported in Table 1 (below), wherein "NM" means not measured.

TABLE 1

| EXAMPLE | SILVER INK | SHRINK FILM | RESISTIVITY, (before anneal.) ohms per square | RESISTIVITY, (after anneal) ohms per square |
|---|---|---|---|---|
| 1 | 1 | 1 | >20,000 | 20 |
| 2 | 1 | 2 | NM | 20 |
| 3 | 1 | 3 | NM | 20 |
| 4 | 2 | 1 | >20,000 | 20 |
| 5 | 2 | 2 | NM | 20 |
| 6 | 2 | 3 | NM | 20 |

The complete disclosures of the patents, patent documents and publications cited herein are incorporated by reference in their entirety as if each were individually incorporated.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. An article containing conductive traces, the article comprising:
    a polymeric film; and
    conductive traces, wherein the conductive traces comprise annealed metal nanoparticles;
    wherein the conductive traces have been formed by depositing a substantially non-conductive coating onto the polymeric film and then exposing the polymeric film to an elevated temperature to cause shrinkage of the polymeric film by at least 10 times its original projected surface area, and wherein the article is used in an electronic device.

2. The article of claim 1, wherein the conductive layer traces comprise a conducting organic polymer.

3. The article of claim 1, wherein the electronic device is selected from the group consisting of amplifiers, receivers, transmitters, inverters, an oscillators.

* * * * *

UNITED STATES PATENT AND TRADEMARK OFFICE
CERTIFICATE OF CORRECTION

PATENT NO. : 7,033,667 B2
APPLICATION NO. : 10/739807
DATED : April 25, 2006
INVENTOR(S) : Jessica L. Voss-Kehl It is certified that error appears in the above-identified patent and that said Letters Patent is hereby corrected as shown below:

Title Page, item [56]
Line 1, U.S. Patent Documents, after "6,548,607" delete "B1" and insert -- B2 -- in place thereof.

Line 2, U.S. Patent Documents, after "6,573,338" delete "B1" and insert -- B2 -- in place thereof.

Line 3, U.S. Patent Documents, after "6,586,483" delete "B1" and insert -- B2 -- in place thereof.

Line 4, U.S. Patent Documents, after "6,593,089" delete "B1" and insert -- B2 -- in place thereof.

Column 5
Line 44, delete "ink-jet" and insert -- inkjet -- in place thereof.
Line 67, delete "ink-jet" and insert -- inkjet -- in place thereof.

Column 6
Line 65, delete "Chemical." and insert -- Chemical -- in place thereof.

Column 8
Line 61, Claim 2, delete "layer" following "conductive".
Line 65, Claim 3, delete "an" and insert -- and -- in place thereof.

Signed and Sealed this

Twenty-sixth Day of September, 2006

JON W. DUDAS
*Director of the United States Patent and Trademark Office*